United States Patent
Rigazio

[19]

[11] Patent Number: 5,821,781
[45] Date of Patent: Oct. 13, 1998

[54] GENERATOR OF PERIODIC CLOCK PULSES WITH PERIOD SELECTABLE BETWEEN THREE PERIODS USING A SYNCHRONZATION SIGNAL WITH TWO LOGIC LEVELS

[75] Inventor: Luca Rigazio, Cigliano, Italy

[73] Assignee: SGS-Thomson Microelectronics S.r.l., Agrate Brianza, Italy

[21] Appl. No.: 855,020

[22] Filed: May 12, 1997

[30] Foreign Application Priority Data

May 15, 1996 [EP] European Pat. Off. ............. 96830281

[51] Int. Cl.⁶ ................................................. H03K 19/00
[52] U.S. Cl. ........................... 327/99; 327/296; 327/298; 327/407
[58] Field of Search ............................. 327/99, 143, 160, 327/291, 294, 295, 296, 298, 407

[56] References Cited

U.S. PATENT DOCUMENTS

| | | | |
|---|---|---|---|
| 4,419,629 | 12/1983 | O'Brien | 327/99 |
| 4,479,097 | 10/1984 | Larson et al. | 331/111 |
| 4,785,262 | 11/1988 | Ryu et al. | 331/111 |
| 4,853,653 | 8/1989 | Maher | 331/49 |
| 5,475,324 | 12/1995 | Tomiyori | 327/99 |
| 5,483,185 | 1/1996 | Scriber et al. | 327/298 |
| 5,623,223 | 4/1997 | Pasqualini | 327/298 |
| 5,652,536 | 7/1997 | Nookala et al. | 327/407 |
| 5,684,418 | 11/1997 | Yanagiuchi | 327/99 |

FOREIGN PATENT DOCUMENTS

A-0 436 246 7/1991 European Pat. Off. .
A-2 592 261 6/1987 France .

OTHER PUBLICATIONS

Patent Abstracts of Japan, vol. 5, No. 163 (E–78), Oct. 20, 1981 & JP-A–56 093421 (Hitachi, K.K.).

*Primary Examiner*—Timothy P. Callahan
*Assistant Examiner*—Jung Ho Kim
*Attorney, Agent, or Firm*—Wolf, Greenfield & Sacks, P.C.

[57] ABSTRACT

Generator of clock pulses having a period selectable between a first period, a second period of greater duration than that of the first period and a third period, with duration imposed by the transitions of a synchronization signal (SYNC) from a first to a second logic level, comprising: a resettable oscillator controlled by a binary selection signal having a first and second logic level, in order to generate periodic pulses having the first or second period depending on the logic level of the said selection signal, the oscillator comprising a pulse extractor triggered by the periodic pulses and by the transitions from first to second logic level of the synchronization signal in order to generate, with each pulse and transition received as input, one of the said periodic clock pulses, acting as reset signal for the oscillator, and a finite state logic machine, having at least two states A, B and inputs for receiving the synchronization signal and the periodic pulses, and generating the selection signal at a first logic level, in state A, and at the second logic level in state B, the machine evolving from state to state as a function of the signals and received as input.

26 Claims, 5 Drawing Sheets

GENERATOR OF PERIODIC CLOCK PULSES WITH PERIOD SELECTABLE BETWEEN THREE PERIODS USING A SYNCHRONZATION SIGNAL WITH TWO LOGIC LEVELS

BACKGROUND OF THE INVENTION

1. Field Of The Invention

The present invention relates to a generator of periodic clock pulses whose period, and hence frequency, can be selected on command.

2. Discussion Of The Related Art

In modern electronic apparatus, in particular data processing and telecommunications systems, there is a need to generate timing signals having a different frequency for various working conditions and which is selectable, on command, between different frequencies.

For this purpose, periodic pulse generators are known whose period is selectable between $2^N$ values, in which selection is controlled by N input binary signals applied to N control terminals of the pulse generator.

In many cases the pulse generator also has to be synchronized with an external periodic signal and has to generate clock pulses having the same period as the periodic signal received.

In these cases one of the N control signals can accomplish this function but it is necessary for the remaining N-1 signals to identify this condition with a predetermined binary code.

Therefore, the number of selectable frequencies, including the external synchronization frequency, drops to $2^N-1$.

In practical applications it is generally sufficient that the pulse generator be controllable so as to generate a clock signal with two different frequencies, plus an external synchronization signal. Two control signals are therefore sufficient.

With the evolution in electronics technology which allows evermore dense levels of integration and the incorporation of clock pulse generators into integrated circuits which accomplish a plurality of other functions there is however a need to minimize the number of control signals originating from outside the circuit, with the advantage of reducing the number and size of the interconnection sites in the integrated circuit and of offering more space for the active elements.

In order to meet this need, pulse generators have been developed and are available on the market having a resettable oscillator and a frequency selectable between one of two oscillator frequencies and a third frequency, defined by an external synchronization signal, these generators being controlled by a single synchronization signal SYNC with three rather than two logic levels.

For example if the signal SYNC has a zero voltage or a maximum voltage +5 V corresponding to two logic levels 0, 1 respectively, a first frequency is selected, and if the signal SYNC has an intermediate voltage level (+2.5 V) corresponding to a third logic level, a second frequency greater than the first is selected.

A transition of the signal SYNC from 0 to 1 makes it possible on the other hand to synchronize the pulse generator to an external frequency requiring to be greater than the first, if not also than the second, in order to be able to use the transitions from 0 to 1 as reset signal for the internal resettable oscillator of the pulse generator.

This solution has considerable drawbacks related to the greater circuit complexity required for generating and discriminating the three logic levels, and even more to the consequent reduction in immunity to noise, which becomes critical or even incompatible with the current tendency of electronics technology towards circuit solutions supplied at voltages below 5 V (in particular 3.3 or 2.6 V) in order to reduce the power dissipated.

SUMMARY OF THE INVENTION

One embodiment of the present invention is directed to a pulse generator for generating clock pulses having a period selectable between a first period, a second period of greater duration than the first period and a third period, of lesser duration than the second period. The pulse generator includes a resettable oscillator controlled by a binary selection signal having a first logic level and second logic level, to generate periodic pulses having the first period if the selection signal is at the first logic level, and the second period if the selection signal is at the second logic level, the oscillator including a pulse extractor having a first input to receive the periodic pulses and a second input to receive the synchronization signal to generate at an output, upon receipt of each pulse at the first input and at each transition from the first logic level to the second logic level of the synchronization signal, one of the clock pulses. The pulse generator further includes a flip-flop that is placed is a first state when the synchronization signal is at the second logic level and is placed in a second state upon receipt of one of the periodic pulses if the synchronization signal is at the first logic level. The flip-flop provides at its output the selection signal having the first logic level when the flip-flop is in the second state and second logic level when the flip-flop is in the first state.

Another embodiment of the present invention is directed to a pulse generator for generating clock pulses having a period selectable between a first period, a second period and a third period. The pulse generator includes a resettable oscillator controlled by a binary selection signal having a first logic level and a second logic level, to generate periodic pulses having the first period if the selection signal is at the first logic level, and the second period if the selection signal is at the second logic level, the oscillator including a pulse extractor having a first input to receive the periodic pulses and a second input to receive the synchronization signal, to generate at an output, upon receipt of each pulse at the first input and each transition from the first logic level to the second logic level, one of the clock pulses. The pulse generator further includes a finite state logic machine, having at least two states A, B and first and second inputs to respectively receive the synchronization signal and the periodic pulses. The state machine in state A, generates the selection signal at the first logic level, and in state B, the state machine generates the selection signal at the second logic level. The state machine passes from state A to state B upon transition of the synchronization signal from the first to the second logic level, and the state machine passes from state B to state A upon reception of one of the periodic pulses if the synchronization is at the first logic level.

Another embodiment of the present invention is directed to a pulse generator for generating clock pulses having a period selectable between a first period, a second period, and a third period. The pulse generator includes a resettable oscillator controlled by a binary selection signal having a first logic level and a second logic level, to generate periodic pulses having the first period if the selection signal is at the first logic level, and the second period if the selection signal is at the second logic level, the oscillator including a pulse extractor having a first input to receive the periodic pulses and a second input to receive the synchronization signal to generate at an output, upon receipt of each pulse at the first input and each transition from the first logic level to the second logic level of the synchronization signal, one of the clock pulses. The pulse generator further includes a finite state logic machine having at least four states A, B1, B, C and first and second inputs for respectively receiving the synchronization signal and the periodic pulses. The state machine, in state A, generates the selection signal at the first logic level, and in states B1, B and C, the state machine generates the selection signal at the second logic level, and in state B1 the state machine also generates a masking signal. The pulse generator also includes a logic gate having a first input to receive the clock pulses, an output that provides the clock pulses, and a second input to receive the masking signal, the masking signal inhibiting the output of the clock pulses. The state machine passes from state A to state B1 upon transition of the synchronization signal from the first to the second logic level, and the state machine passes from state B1 to state B and from state C to state A upon reception of one of the periodic pulses and from state B to state C upon transistion of the synchronization signal from the second to the first logic level.

Another embodiment of the present invention is directed to a pulse generator comprising an input to receive a synchronization signal having a variable period and having a logic level having one of a first value and a second value, and means for providing a clock signal having a period equal to one of a first value, a second value and a third value. When the period of the clock signal has the third value, pulses of the clock signal are synchronous with pulses of the synchronization signal. The period of the clock signal is set to one of the first value, the second value and the third value based on the logic level of the synchronization siganl and the period of the synchronization signal.

Another embodiment of the present invention is directed to a method of generating a clock signal, having a period, in response to a synchronization signal having a variable period and having a logic level having one of a first value and a second value. The method includes steps of setting the period and clock signal to a first value when the logic level of the synchronization signal has the first value, setting the period of the clock signal to the second value after the logic level of the synchronization signal transitions from the first value to the second value, and setting the period of the clock signal equal to the period of the synchronization signal when the period of the synchronization signal is less than the predetermined value.

DETAILED DESCRIPTION

Figure 1:
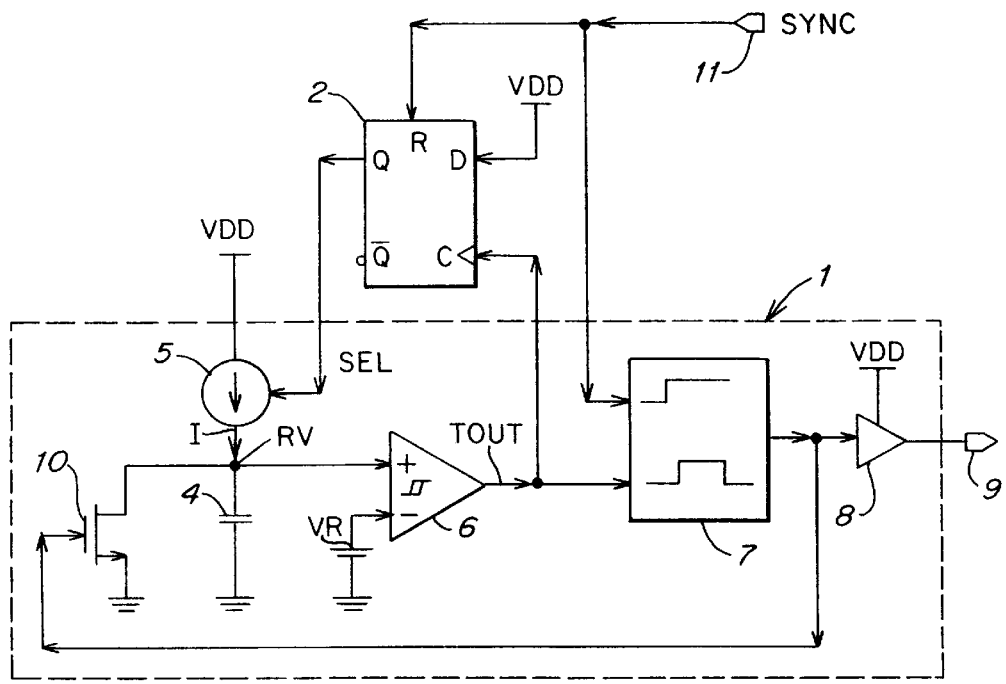
FIG. 1 represents a preferred embodiment of a periodic pulse generating circuit in accordance with one embodiment of the present invention.

With reference to FIG. 1 a periodic pulse generator in accordance with the present invention comprises a resettable oscillator 1, in itself conventional, and a D-type flip-flop 2 with asynchronous reset R active at high level and with the input D biased high.

The oscillator 1 comprises a capacitor 4 connected between a constant current generator 5 supplied with a voltage VDD, for example +5 V and earth.

The variable-voltage plate of the capacitor 4 is connected to the non-inverting input of a hysteresis comparator 6, with its inverting input connected to a reference voltage VR.

The output of the comparator 6 is connected to an input of a pulse extractor 7, in itself conventional, for example a monostable whose output is connected, preferably through a driver circuit 8, permanently enabled, to an output terminal 9 for periodic clock pulses CLK.

The oscillator is completed with a switch 10, for example a MOS transistor, which short-circuits the capacitor 4 when a positive electrical level is applied to its gate electrode, connected to the output of the pulse extractor.

The operation of the oscillator is known: when the charging voltage of the capacitor 4 exceeds the reference voltage VR, the comparator outputs a voltage pulse TOUT with positive electrical level and triggers the pulse extractor 7.

This then generates a positive voltage pulse of duration $\Delta$, imposed by the extractor, which is applied to the MOS transistor 10 and short-circuits the capacitor 4 which discharges.

The pulsed signal TOUT output by the comparator drops rapidly to zero electrical level.

The voltage pulse output by the pulse extractor 7, applied through the driver 8 to the output terminal 9, constitutes a periodic clock pulse CLK.

In fact with the drop of the pulse CLK at the output of the pulse extractor to low electrical level, the MOS transistor 10 is disabled and the capacitor 4, discharged, begins to recharge, attaining a charging voltage equal to VR after a time interval t equal to VR.C/I (where C is the value of the capacitor 4 and I the constant charging current) giving rise to the generation of a new pulse CLK and so on.

The period of repetition of the pulses CLK is given by $t+\Delta$.

The constant current generator 5 is controlled by a signal SEL for generating two distinct current values, for example a current having a first value I1 if the signal SEL has a positive electrical level and a second value I2, less than the first, if the signal SEL has a zero electrical level. Therefore, depending on whether signal SEL has a positive level or has a zero electrical level, signal CLK will be generated at one of two frequencies f1 and f2 respectively with f1>f2 and period P1=1/f1<P2=1/f2.

According to the present invention, in order to generate the signal SEL use is made of a synchronization signal SYNC with two electrical/logic levels which is received through a single input terminal 11 connected to the reset input of the flip-flop 2 and to a second input of the pulse extractor 7.

The pulse extractor is triggered by rising edges of the signals applied to its inputs.

Hence the pulse extractor outputs a pulse CLK, not only on reception of a pulse TOUT, but also on reception of a transition of the signal SYNC from level 0 to level 1, i.e. from low electrical level to high electrical level.

The Q output of the flip-flop 2 is connected to a control input of the constant current generator 5.

It is obvious that if the signal SYNC is at logic level 1, corresponding to a positive electrical level, the flip-flop 2 is forced into the reset state and a signal SEL with low logic/electrical level is present at its Q output and is applied to the constant current generator.

A transition of the signal SYNC from logic level 0 to logic level 1 resets the flip-flop 2 which, in turn, imposes a 0 logic level on the signal SEL, even if the level of the signal SYNC returns to 0.

The flip-flop 2 has its clock input connected to the output of the comparator 6 in order to receive the signal TOUT.

With a transition of the signal TOUT from 0 electrical level to positive level, the flip-flop 2 is placed in the set state if and only if the signal SYNC is at logic level 0.

It is therefore obvious that the logic/electrical level of the signal SEL depends not only on the level of the signal SYNC but, in the case in which the signal SYNC is of periodic pulsed nature, also on the frequency of the transitions from level 0 to level 1 of the signal SYNC.

If the signal SYNC is placed at and held at zero logic/electrical level for a period greater than the period P2, the flip-flop 2, initially in the reset state, is set, at the latest with a delay P2 from the instant at which the signal SYNC takes the zero logic/electrical level, through the effect of a first pulse TOUT received at the clock input, and subsequently the oscillator 1 generates pulses TOUT and CLK with a period equal to P1 (in fact SEL=1).

If the signal SYNC rises to logic level 1 and is held at this level for a time greater than the period P2, the flip-flop toggles immediately and is then held in reset, a pulse CLK is generated, with the transition of SYNC from 0 to 1, the capacitor 4 is discharged and the oscillator begins to generate periodic pulses CLK with period P2>P1 (in fact SEL=0).

If the signal SYNC varies periodically in level and consists of positive pulses with period P3 less than P2, the flip-flop is reset and the oscillator 1 is periodically placed in the reset state at time intervals which are less than the oscillation period P2, imposed by the flip-flop 2 in the reset state, and hence is not able to generate pulses TOUT and cause the flip-flop to pass to the set state.

Clock pulses CLK with a period equal to the period P3 imposed by the signal SYNC are therefore present at the output of the oscillator, more properly of the pulse extractor 7.

It is therefore obvious that the pulse generator of FIG. 1, controlled by the single signal SYNC having two logic levels, can generate pulses with period P1, with period P2 and can also be synchronized to the period of the signal SYNC in order to generate periodic clock pulses CLK with period P3 equal to the period of the synchronization signal, on condition that such period be less than P2.

We shall see below how these limitations also can be removed.

The circuit of FIG. 1 is purely illustrative: it is in fact obvious that depending on the direct or inverse relation between logic and electrical levels of the signals and on the action of the signal SEL in relation to the periods P1,P2, the circuit connections of the flip-flop 2 to the other elements may be different.

Additionally, the oscillator 1 may have a different structure to that represented.

Figure 2:
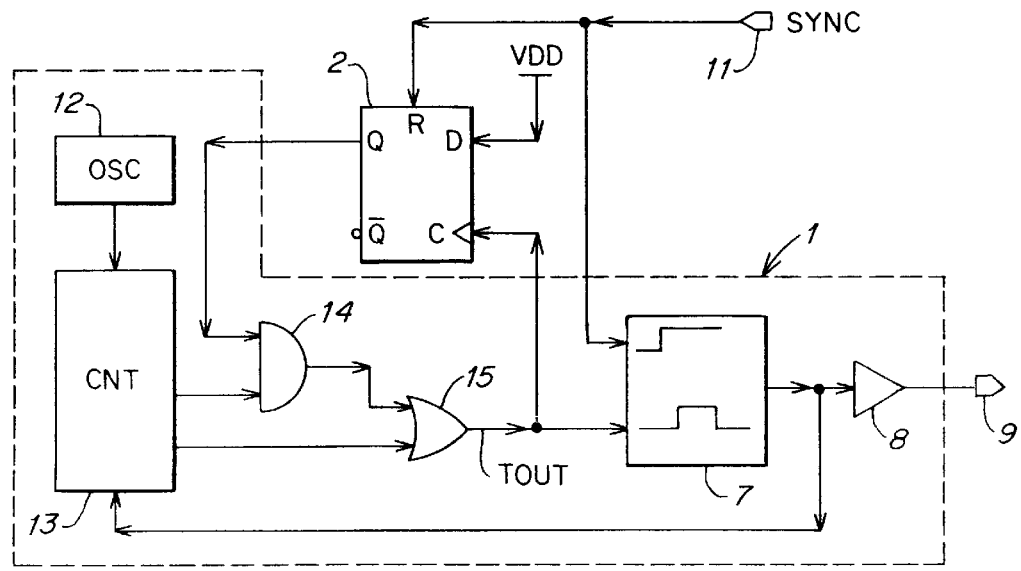
FIG. 2 represents a second embodiment of the present invention.

For example, FIG. 2 represents a periodic pulse generator which is wholly equivalent, from the functional point of view, to that of FIG. 1, in which the oscillator 1 comprises a fixed frequency oscillator 12 which increments a resettable counter 13.

The signal SEL selects via AND-OR logic 14, 15 or the equivalent, a countvalue, from two values output by the counter and applies it as input to a pulse extractor 7 identical to that of FIG. 1.

The output of the pulse extractor supplies the output terminal 9 with periodic pulses CLK which also act as reset for the counter 13, exactly as in the case of FIG. 1.

The logic for control and generation of the signal SEL is identical to that of FIG. 1 and consists of the flip-flop 2, of D type, with D input high, reset input which receives the signal SYNC and clock input which receives the count signal TOUT selected as output by the counter 13 and by the selection logic 14, 15.

The Q output of the flip-flop 2 is connected to an input of the AND gate 14 so as to force, when at logic level 0, the oscillator 1 to generate the pulses CLK with a period of greater duration.

Figure 3:
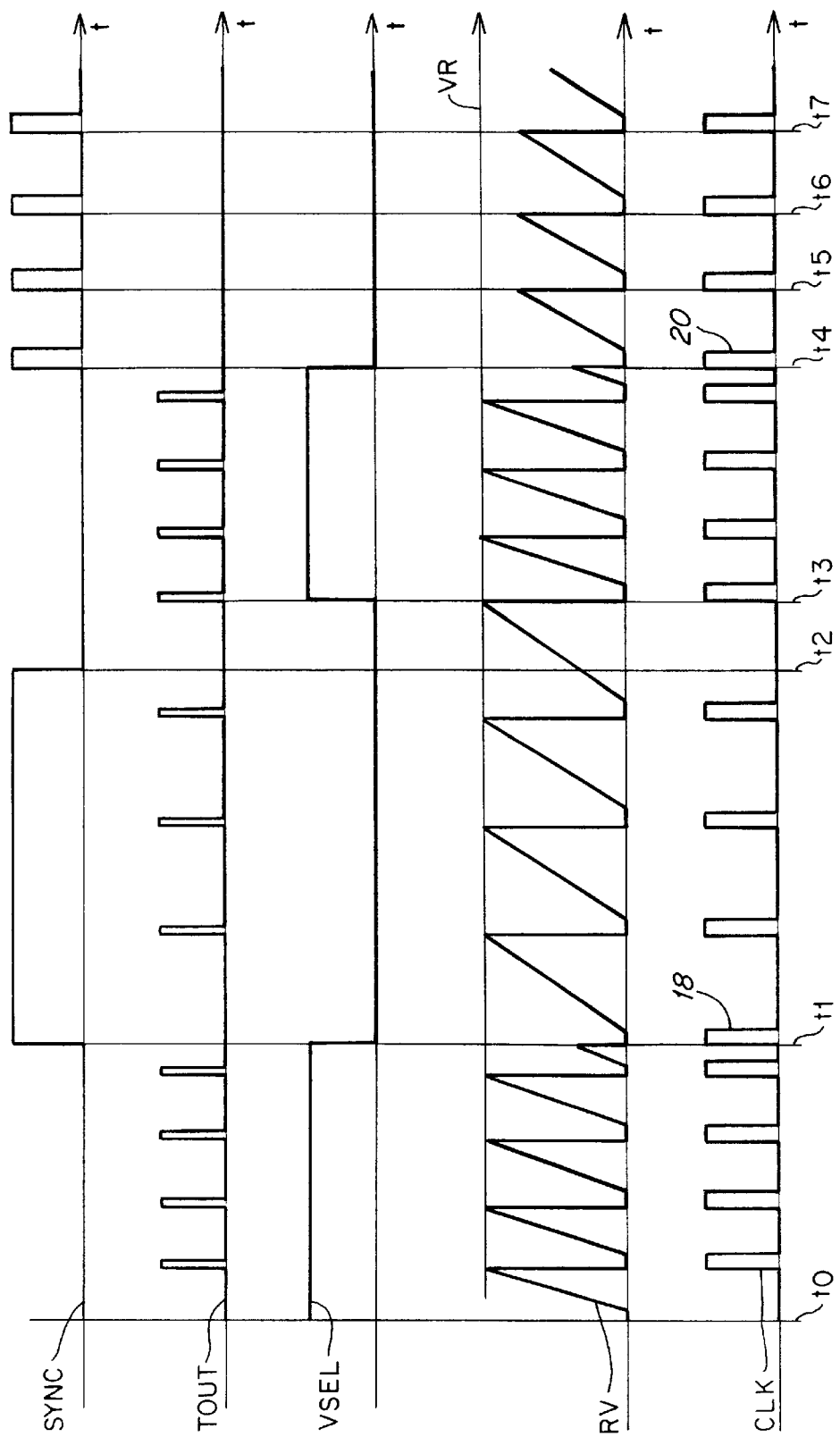
FIG. 3 represents a time diagram of the logic/electrical level of a few points in the generator of FIGS. 1 and 2 under the various operating conditions.

The time diagrams of FIG. 3 represent the operation of the circuit of FIG. 1 and FIG. 2 in detail.

In particular the diagram SYNC represents the logic level of the signal SYNC, the diagram TOUT represents the output pulses from the comparator 6 (FIG. 1) or from the gate 15 (FIG. 2), the diagram VSEL represents the logic level of the Q output of the flip-flop 2, the diagram RV (significant only in the case of FIG. 1) represents the charging voltage of the capacitor 4, and the diagram CLK represents the periodic pulses CLK output by the pulse extractor 7 and available at the output terminal 9 of the pulse generator.

It is assumed that at the instant t0 the signal SYNC is at level 0 and the flip-flop 2 is in the set state.

The oscillator 1 then generates pulses TOUT and CLK having period P1.

At the instant t1, in a manner which is completely asynchronous with respect to the period of the pulses CLK, the signal SYNC goes to logic level 1, with three effects.

1) resetting of the flip-flop 2 and selection of a charging current I2 for the capacitor 4 (FIG. 1) or enabling of the AND gate 14 (FIG. 2), 2) generation of a pulse CLK identified by the numeral 18 and consequently 3) resetting of the oscillator 1.

If, as shown the signal SYNC is held at level 1 for a duration greater than the period P2 determined by the charging current I2, in the case of FIG. 1, or by a higher count value of the counter 13, in the case of FIG. 2, the oscillator 1 continues to generate pulses with period P2 throughout the time for which SYNC is at logic level 1.

In fact the pulses TOUT applied to the clock input of flip-flop 2 have no effect on the state of the flip-flop which is forced into the reset state by the signal SYNC=1.

At an instant t2, in a manner which is completely asynchronous with respect to the pulses CLK, the signal SYNC goes from logic level 1 to logic level 0.

This transition has the sole effect of allowing the setting of the flip-flop 2 which becomes set with the immediately subsequent pulse TOUT.

Therefore at the instant t3 the immediately subsequent pulse TOUT sets the flip-flop 2.

From the instant t3 onwards, if SYNC is held at level 0 the oscillator 1 produces periodic pulses of period P1. If from a generic instant t4 onwards the signal SYNC is periodically switched between the two levels 0 and 1 with period P3<P2 in order to compel the oscillator to generate clock pulses with period P3, at the instant t4:

1) a charging current I2 is selected for the capacitor 4
2) the oscillator 1 is reset
3) a clock pulse CLK is generated, identified by the numeral 20.

At subsequent instants t5, t6, t7, the transition from level 0 to level 1 of the signal SYNC, repeated with period P3<P2, causes the resetting of the oscillator 1 and the generation of a corresponding pulse CLK before the oscillator can attain a state which causes the generation of a pulse TOUT and consequently the resetting of the flip-flop 2.

From this condition of working with generation of clock pulses synchronized with the external synchronization signal SYNC, it is possible to pass to the condition of working which corresponds to the generation of periodic clock pulses CLK with period P1 or equally to the condition of working which corresponds to the generation of periodic clock pulses CLK with period P2.

In the first case, however, the pulse CLK which follows the last pulse CLK synchronized with the signal SYNC is however generated with a delay P2 and it is only through the effect of this pulse that the flip-flop 2 becomes reset.

The diagrams of FIG. 3 therefore reveal the following limitations:

the period P3 of external synchronization has to be less than P2, in the transitions from one operating condition to another it is possible for output pulses CLK to occur, such as 18, 20, which have a time delay from the previous pulse which differs from P1,P2 and which, in particular, is less than P1.

However these limitations, where required by specific applicational needs, can readily be overcome as will be explained below.

The logic circuit consisting of the flip-flop 2 can be regarded in more general terms as a state machine, able to take two states A,B, which receives as input the signals SYNC and TOUT and evolves in consequence.

Figure 4:
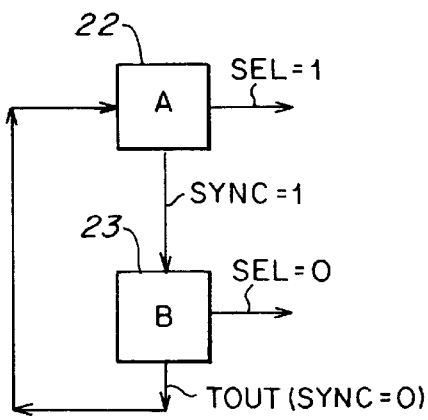
FIG. 4 represents a block diagram of a basic and generalized embodiment of a frequency selection and control circuit for the pulse generators of FIGS. 1 and 2, viewed as a finite state logic machine.

FIG. 4 represents the block diagram of the state machine equivalent to the logic circuits of FIGS. 1 and 2.

When the machine is in state A (block 22) corresponding to the set state of the flip-flop 2 and to the signal SYNC at level 0, the machine outputs the signal SEL=1.

With a transition of SYNC from 0 to 1 the machine passes to state B represented by block 23 (corresponding to the reset state of the flip-flop 2 and to the signal SYNC at level 1), and outputs the signal SEL=0.

From state B it passes to state A, setting the flip-flop 2, with the joint reception of a pulse TOUT and the signal SYNC at level 0.

Even if the logic circuit consisting of the flip-flop 2 comprises a single flip-flop, the circuit can also be regarded as a state machine, able to take three states A, B, C, which receives as input the signals SYNC and TOUT and evolves in consequence.

Figure 5:
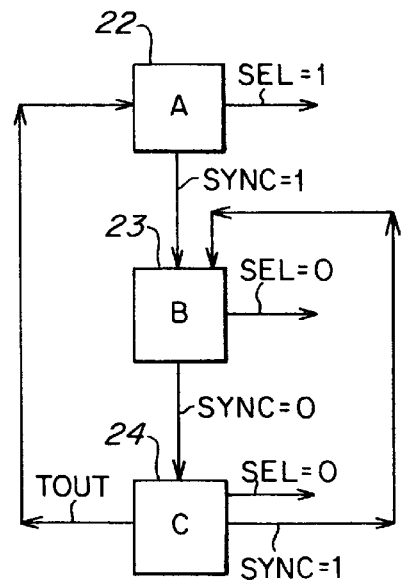
FIG. 5 represents a variant of the logic machine of FIG. 4.

FIG. 5 represents the block diagram of this state machine.

When the machine is in state A (block 22) corresponding to the set state of the flip-flop 2 and to the signal SYNC at level 0, the machine outputs the signal SEL=1.

With a transition of SYNC from 0 to 1 the machine passes to state B represented by block 23 (corresponding to the reset state of the flip-flop 2 and to the signal SYNC at level 1), and outputs the signal SEL=0 and is not able to modify its state through the effect of the pulses TOUT.

With a subsequent transition of SYNC from 1 to 0 the machine passes to state C represented by block 24, corresponding to the reset state of the flip-flop 2, and to level 0 of the signal SYNC. In this state the machine continues to output the signal SEL=0, but is able to modify its state through the effect of a pulse TOUT.

It passes from state C to state A with the setting of the flip-flop 2, on reception of the first immediately subsequent pulse TOUT.

If on the other hand the signal SYNC goes to level 1 before a pulse TOUT is received, the machine returns to state B.

The cyclic transition from B to C and back to B occurs when the signal SYNC is of periodic nature, with period P3<P2, acting as synchronization signal.

This interpretation demonstrates the capacity of the machine to impose three different operating modes on the oscillator.

As already stated, the pulse generator controlled by this machine includes, in the transition from state A to state B, the generation of spurious pulses such as 18 and 19 (FIG. 3) which may be temporally very close to the previous pulses: in some applications this may constitute a drawback.

Figure 6:
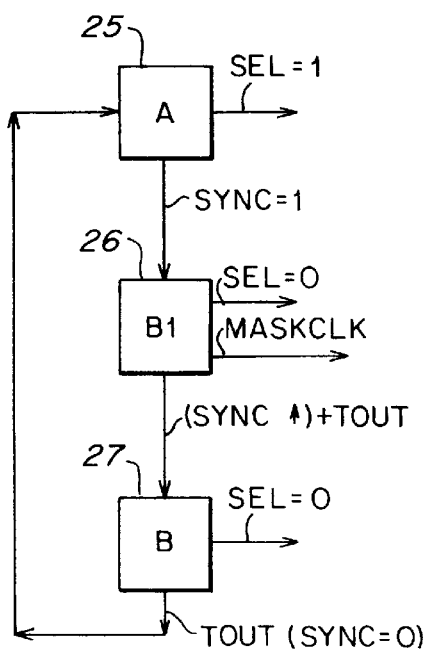
FIG. 6 represents an enhancement of the logic machine of FIG. 4.

However the state machine of FIG. 4 and 5 can be modified in an extremely simple manner so as to remove this limitation and is represented in FIG. 6.

In FIG. 6 the logic machine has three states A,B1,B, represented by blocks 25,26,27 respectively.

State A corresponds to state A of the machine of FIG. 4 and from state A it passes to the temporary state B1 with a transition of SYNC from level 0 to level 1.

In state B1 the state machine generates the signal SEL=0 and a signal MASKCLK which disables the enforcement of the pulses CLK at output or, at least, of the pulses due to the transition of SYNC.

It passes from state B1 to a state B on the occurrence of a subsequent transition of SYNC from 0 to 1or on the occurrence of a pulse TOUT.

In state B, equivalent to state B of the machine of FIG. 4, the state machine generates the signal SEL=0 and revokes the signal MASKCLK.

It passes from state B to state A on the occurrence of a pulse TOUT jointly with the signal SYNC=0.

Figure 7:
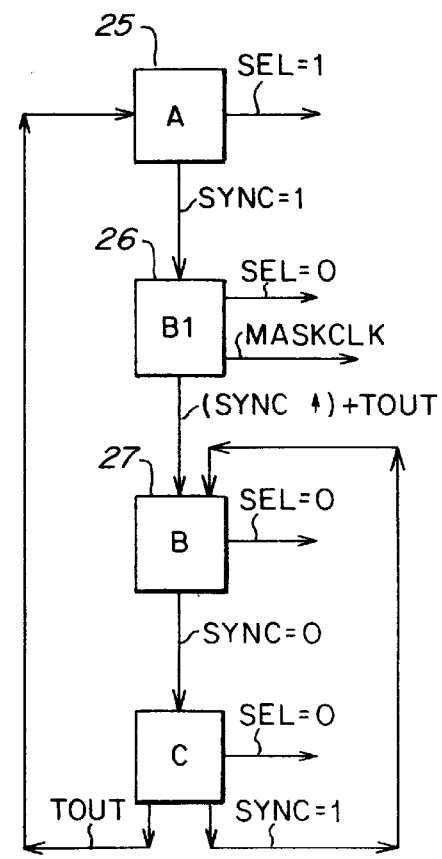
FIG. 7 represents an enhancement of the logic machine of FIG. 5.

By analogy with FIG. 5, the state machine can be viewed as a machine with four states A,B1,B,C and represented in FIG. 7.

In this case also we pass from block 25 (state A) to block 26 (state B1) with a transition of SYNC from 0 to 1 and from block 26 to block 27 (state B) on the occurrence of a pulse TOUT or with a transition of SYNC from 0 to 1, but we pass from state B to state C (equivalent to state C of FIG. 5) on the occurrence of the condition SYNC=0.

We return from state C to state B if SYNC=1 or to state A on the occurrence of a pulse TOUT.

Figure 8:
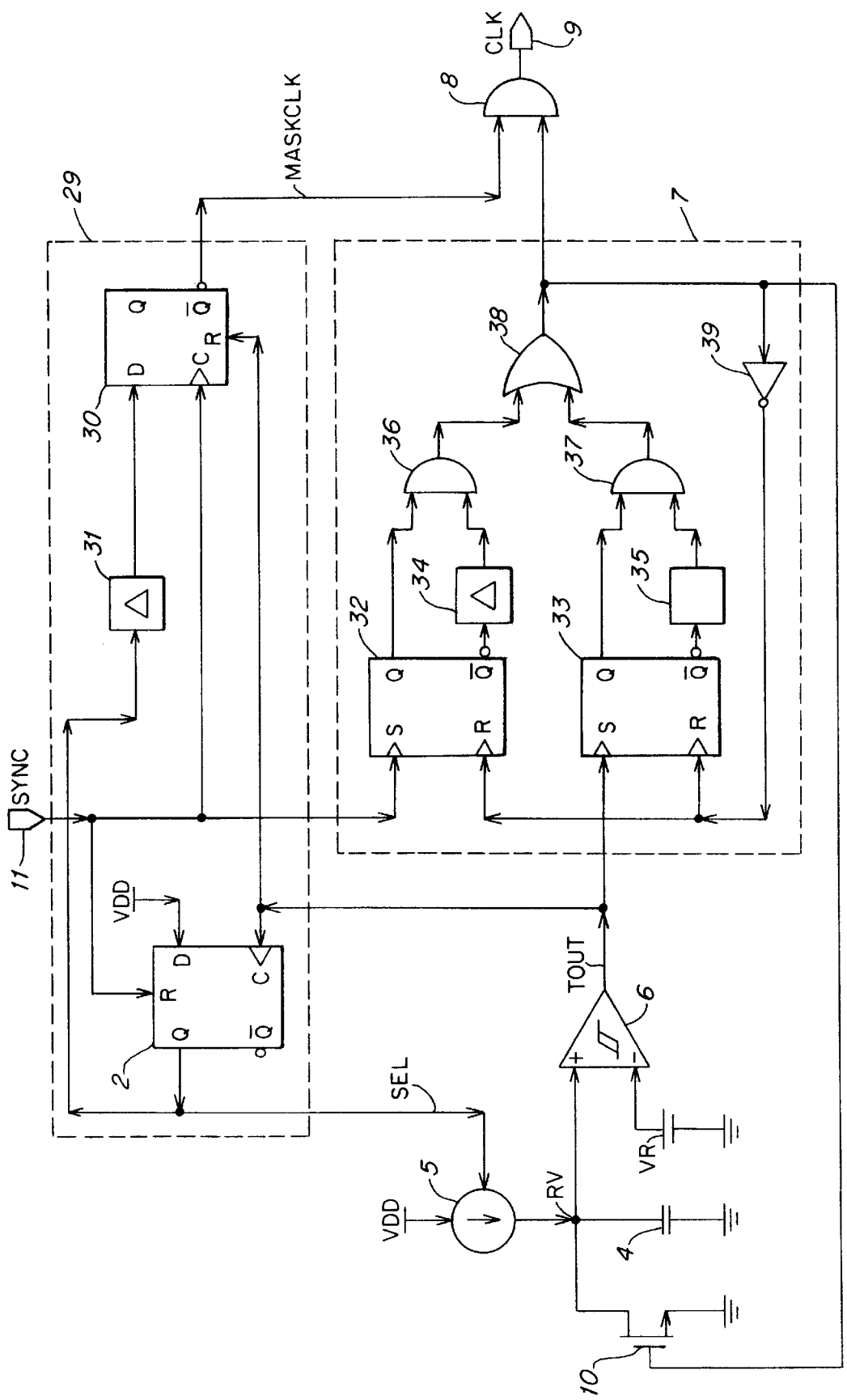
FIG. 8 represents a preferred embodiment of a clock pulse generator incorporating a logic machine which is functionally equivalent to that of FIG. 6.

FIG. 8 represents a preferred embodiment from among the many possible embodiments of the state machine of FIG. 6 together with an oscillator of the type of FIG. 1.

In this context, a preferred embodiment of a pulse extractor 7 is also presented.

In FIG. 8 the elements corresponding to those of FIG. 1 are identified by the same reference numerals.

The state machine 29 which governs the operation of the oscillator essentially comprises two D-type flip-flops, 2, 30 respectively, and one delay element 31.

The pulse extractor 7 consists of two RS-type flip-flops 32,33, triggered by positive edges applied respectively to the set and reset inputs, two delay elements 34,35, two AND gates 36,37, with two inputs, one OR gate 38 with two inputs and an inverting NOT element 39.

The signal SYNC, received at the terminal 11, is applied to the clock input of the flip-flop 30, to the reset input of the flip-flop 2 and to the set input of the flip-flop 32 whose Q output is connected directly to a first input of the gate 36 and whose inverting output /Q is connected to a second input of the AND gate 36 via the delay element 34.

The output of the AND gate 36 is connected to a first input of the AND gate 38.

The signal TOUT output by the comparator 6 is applied to the clock input of the flip-flop 2, to the reset input of the flip-flop 30 and to the set input of the flip-flop 33.

The Q output of the flip-flop 33 is connected to a first input of the AND gate 37 and the /Q output is connected to the second input of the AND gate 37 via the delay element 35.

The output of the AND gate 37 is connected to the second input of the OR gate 38, the output of which is connected to the input of the inverting element 39 and to the input of the output driver 8 which, as illustrated, can be an AND gate with two inputs.

The output of the inverting element 39 is connected to the reset input of the flip-flops 32,33.

Finally, the Q output of the flip-flop 2 is connected, as well as to the control input of the constant current generator 5, also to the D input of the flip-flop 30, via the delay element 31.

The complement output /Q of the flip-flop 30 is connected to an input of the AND gate 8.

The operation of the pulse extractor 7 is extremely simple: the flip-flops 32 and 33 are, under quiescent conditions, in the reset state and a 0 logic level is present at the output of the gates 36,37,38.

With a transition of SYNC from 0 to 1, the flip-flop 32 becomes set, and therefore a pulse with logic level 1 of duration equal to $\Delta$ appears at the output of the gates 36, 38, $\Delta$ being the delay of the element 34.

If the AND gate 8 is enabled (flip-flop 30 in the reset state) the same pulse is available at the output 9 as clock signal CLK.

On the termination of the pulse the transition from 0 to 1 of the output of the NOT 39 resets the flip-flop 32.

Similarly, on the occurrence of a pulse TOUT at the output of the comparator 6, the flip-flop 33 becomes set and a pulse with logic level 1 of duration $\Delta$ appears at the output of the gates 37, 38 (and possibly 8), $\Delta$ being the delay of the element 35.

In this case also the flip-flop 33 is reset at the end of the pulse.

The operation of the state machine 29 is equally simple.

Its states, matching the states A,B1,B of FIG. 6, are:

STATE A: flip-flop 2 set and flip-flop 30 reset,
STATE B1: flip-flop 2 reset and flip-flop 30 set,
STATE B: flip-flop 2 reset and flip-flop 30 reset.

We pass from state A to state B1 with a transition of SYNC from 0 to 1. This transition resets the flip-flop 2 and sets the flip-flop 30.

In fact, the signal applied to the D input of the flip-flop 30 is 1 and drops to 0 with a delay $\Delta$.

Therefore the /Q output of the flip-flop 30, placed at 0 (MASKCLK enforced) prevents the gate 8 from outputting the pulse generated by the components 32,34,36.

We pass from state B1 to state B on the occurrence of the first among the conditions: transition of SYNC from 0 to 1 or generation of a pulse TOUT.

This happens, in the first case because the flip-flop 2 is reset and a 0 level is applied to its D input, and in the second case because the signal TOUT acts on the reset input of the flip-flop 30.

In state B the signal MASKCLK is revoked and the pulses generated by the pulse extractor 7, both with each transition of SYNC from 0 to 1 and with each pulse TOUT received, are transferred to the output terminal 9.

Finally, we return from state B to state A, if the signal SYNC is at 0, on the occurrence of a pulse TOUT.

This pulse determines the setting of the flip-flop 2, whereas the flip-flop 30 is already reset.

It is therefore obvious that with an extremely simple state machine such as that described, the spurious pulses such as 18 and 20 of FIG. 3 are eliminated.

Equally simple is the embodiment of a state machine which allows the generator of periodic pulses to synchronize with an external periodic signal SYNC with period P3 which is even greater than the period P2.

Figure 9:
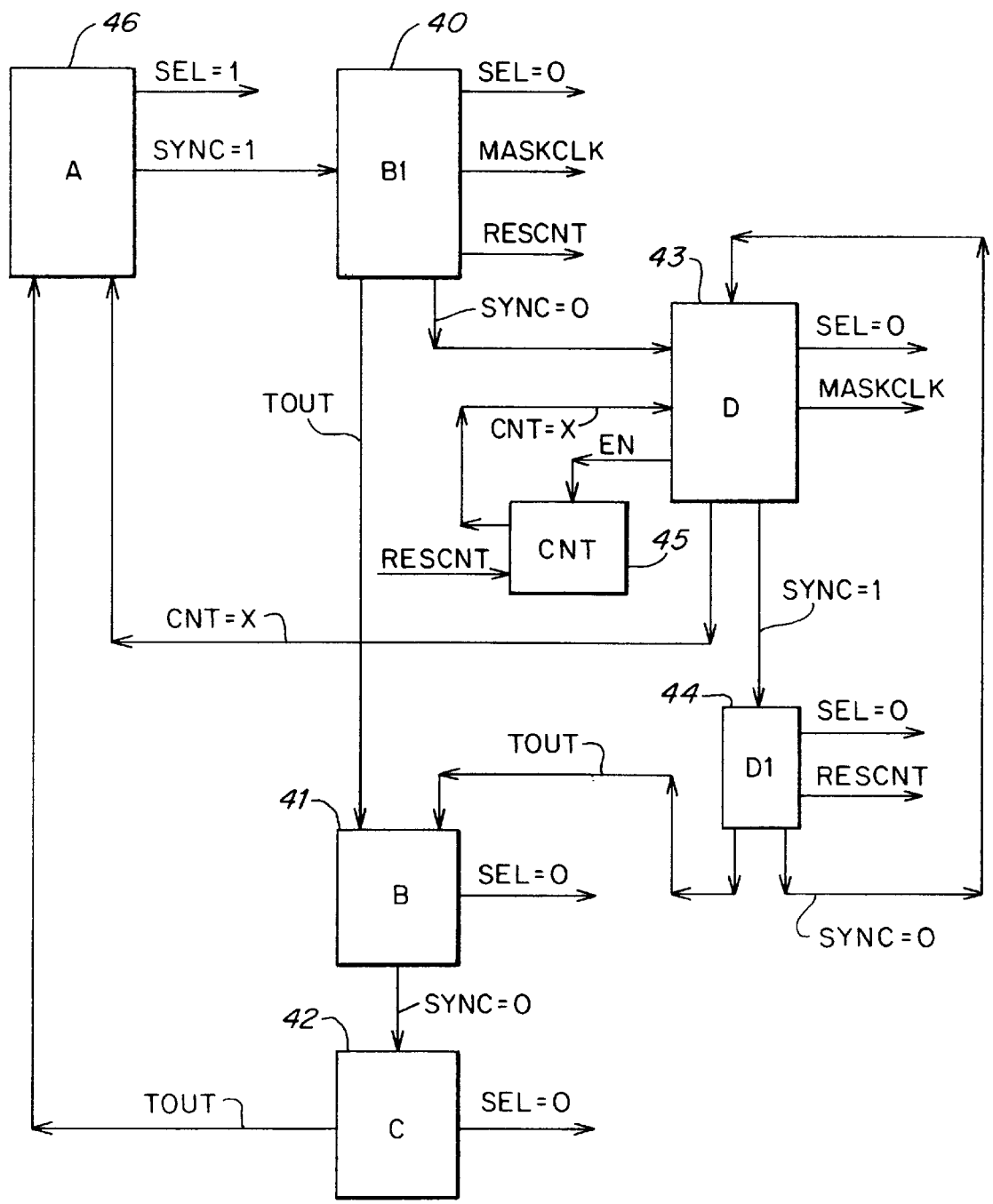
FIG. 9 represents a further enhancement of the logic machine of FIG. 7.

This machine is represented in the block diagram of FIG. 9.

We pass from state A (block 39), in which the signal SEL=1 is generated, to state B1 (block 40) with a transition of SYNC from 0 to 1.

In state B1 the machine generates the signal SEL=0 and enforces the signal MASKCLK.

For reasons which we shall see, a signal RESCNT is also enforced.

We pass from state B1 to state B (block 41) with the reception of a pulse TOUT.

In state B the machine generates the signal SEL=0.

We pass from state B to state C (block 42) with a transition of SYNC from 1 to 0.

In state C also, the machine generates the signal SEL=0.

We pass from state C to state A with the reception of a pulse TOUT.

Apart from the states A,B1,B,C, similar to the namesake states of the machine of FIG. 7, the state machine can take the states D and D1 (blocks 43,44 respectively).

We pass from state B1 to state D with a transition of SYNC from 1 to 0.

In state D the machine generates the signal SEL=0 and enforces the signal MASKCLK.

This prevents, throughout the time that the machine is in state D, the transfer to the output of the pulse generator of the pulses CLK consequent upon pulses TOUT received by the pulse extractor.

We pass from state D to state D1 with a transition of SYNC from 0 to 1.

In state D1 the signal SEL=0 is generated and the signal MASKCLK is revoked.

Therefore the pulse CLK consequent on the transition of SYNC from 0 to 1 is transferred to the output of the generator.

We pass from state D1 to state D with a transition of SYNC from 1 to 0.

In order to exit the loop consisting of the two states D and D1 it is sufficient to hold the signal SYNC at the level 1, following an external sequence of synchronization pulses SYNC, with period P3 also (but not necessarily) greater than P2, in the course of which SYNC must, as sole condition, be at level 1 for a duration less than P2, for a time interval of duration greater than P2.

With the reception of a pulse TOUT we then pass from state D1 to state B.

This means that from an operating regime of external synchronization we must necessarily pass to the operating regime in which the oscillation period is P2 (SYNC=1), on penalty of the occurrence of a hang-up situation.

In order, however, to be certain of being able to exit from the operating regime of external synchronization it is therefore expedient to provide for a "time out" mechanism which effects exit from state D even if the signal SYNC remains at 0.

For this purpose it is sufficient to predispose a counter CNT 45, enabled by a signal EN, active in the state D, which evolves with each pulse TOUT received as input.

The counter 45 is reset by the signal RESCNT already mentioned, active in state B1 and in state D1.

It is therefore possible to exit from state D in order to pass to state A when the counter attains a predetermined count value CNT=X.

It is clear that the preceding description relates solely to a few embodiments which the state machine may take and that numerous variants may be supplied, in particular relating to the function of the logic elements, to the correspondence between logic and electrical levels and to the level, associated with the various operating regimes, of the control signals.

Having thus described at least one illustrative embodiment of the present invention, various alternations, modifications and improvements will readily occur to those skilled in the art. Such alternations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A pulse generator for generating clock pulses having a period selectable between a first period, a second period of greater duration than the first period and a third period, of lesser duration than the second period, wherein when the third period is selected, the clock pulses are synchronous with transitions of a synchronization signal from a first logic level to a second logic level, the pulse generator comprising:

a resettable oscillator controlled by a binary selection signal having a first logic level and a second logic level, to generate periodic pulses having the first period when the selection signal is at the first logic level, and the second period when the selection signal is at the second logic level, the oscillator including a pulse extractor having a first input to receive the periodic pulses and a second input to receive the synchronization signal to generate at an output, upon receipt of each pulse at the first input and each transition from the first logic level to the second logic level of the synchronization signal at the second input, one of the clock pulses, the clock pulses acting as a reset signal for the oscillator; and a flip-flop having a first input to receive the synchronization signal, a second input to receive the periodic pulses and an output, the flip-flop being placed in a first state when the synchronization signal is at the second logic level and being placed in a second state upon receipt of one of the periodic pulses when the synchronization signal is at the first logic level, the flip-flop providing at its output the selection signal having the first logic level when the flip-flop is in the second state and the second logic level when the flip-flop is in the first state.

2. The pulse generator according to claim 1, wherein the flip-flop is a D-type flip-flop having an asynchronous Set/Reset input corresponding to the first input and a clock input corresponding to the second input.

3. The pulse generator according to claim 1, further comprising means for masking a clock pulse generated by the pulse extractor upon transition of the synchronization signal from the first to the second logic level, when the selection signal is at the first logic level.

4. A pulse generator for generating clock pulses having a period selectable between a first period, a second period of greater duration than the first period and a third period, of lesser duration than the second period, wherein when the third period is selected, the clock pulses are synchronous with transitions of a synchronization signal from a first logic level to a second logic level, the pulse generator comprising:

a resettable oscillator controlled by a binary selection signal having a first logic level and a second logic level, to generate periodic pulses having the first period when the selection signal is at the first logic level, and the second period when the selection signal is at the second logic level, the oscillator including a pulse extractor having a first input to receive the periodic pulses and a second input to receive the synchronization signal to generate at an output, upon receipt of each pulse at the first input and each transition from the first logic level to the second logic level of the synchronization signal, one of the clock pulses, the clock pulses acting as a reset signal for the oscillator; and a finite state logic machine, having at least two states A, B, and first and second inputs to respectively receive the synchronization signal and the periodic pulses, wherein the state machine in state A, generates the selection signal at the first logic level, and in state B, the state machine generates the selection signal at the second logic level;

wherein the state machine passes from state A to state B upon transition of the synchronization signal from the first to the second logic level, and the state machine passes from state B to state A upon reception of one of the periodic pulses when the synchronization signal is at the first logic level.

5. The pulse generator according to claim 4, further comprising a logic gate having a first input to receive the clock pulses, an output that provides the clock pulses and a second input to receive a masking signal that inhibits the output of the clock pulses, and wherein the state machine has a third state B1 in which the state machine generates the selection signal at the second logic level and provides the masking signal to the second input of the logic circuit, the state machine passing from state A to state B1 upon transition of the synchronization signal from the first to the second logic level and from state B1 to state B upon transition of the synchronization signal from the first to the second logic level or upon reception of one of the periodic pulses.

6. A pulse generator for generating clock pulses having a period selectable between a first period, a second period of greater duration than the first period and a third period, of lesser duration than the second period, wherein when the third period is selected, the clock pulses are synchronous with transitions of a synchronization signal from a first logic level to a second logic level, the pulse generator comprising:

a resettable oscillator controlled by a binary selection signal having a first logic level and a second logic level, to generate periodic pulses having the first period when the selection signal is at the first logic level, and the second period when the selection signal is at the second logic level, the oscillator including a pulse extractor having a first input to receive the periodic pulses and a second input to receive the synchronization signal to generate at an output, upon receipt of each pulse at the first input and each transition from the first logic level to the second logic level of the synchronization signal, one of the clock pulses, the clock pulses acting as a reset signal for the oscillator; and a finite state logic machine, having at least four states A, B1, B, C and first and second inputs for respectively receiving the synchronization signal and the periodic pulses, wherein the state machine, in state A, generates the selection signal at the first logic level, in states B1, B and C, the state machine generates the selection signal at the second logic level, and in state B1, the state machine also generates a masking signal;

a logic gate having a first input to receive the clock pulses, an output that provides the clock pulses, and a second input to receive the masking signal, the masking signal inhibiting the output of the clock pulses;

wherein the state machine passes from state A to state B1 upon transition of the synchronization signal from the first to the second logic level, and the state machine passes from state B1 to state B and from state C to state A upon reception of one of the periodic pulses and from state B to state C upon transition of the synchronization signal from the second to the first logic level.

7. The pulse generator according to claim 6, wherein the state machine further comprises:

a fifth state D, in which the state machine generates the selection signal at the second logic level and generates the masking signal, wherein the state machine passes from state B1 to state D upon transition of the synchronization signal from the second logic level to the first logic level; and a sixth state D1 in which the machine generates the selection signal at the second logic level, wherein the state machine passes from state D to state D1 upon transition of the synchronization signal from the first logic level to the second logic level, from state D1 to state D upon transition of the synchronization signal from the second logic level to the first logic level and from state D1 to state B upon reception of one of the periodic pulses;

wherein when the state machine is in state C, a subsequent reception of one of the periodic pulses passes the state machine from state C to state A.

8. The pulse generator according to claim 7, wherein the state machine comprises a counter, enabled by an enable signal generated by the state machine when the state machine is in state D, the counter being reset by a reset signal generated by the state machine when the state machine is in one of states B1 and D1, the counter having an input to receive the periodic pulses, the counter counting the periodic pulses when enabled to generate a count value, the state machine passing from state D to state A when the count value is equal to a predetermined count value.

9. A pulse generator comprising:

an input to receive a synchronization signal having a variable period and having a logic level having one of a first logic value and a second logic value;

an output that provides a clock signal having a period equal to one of a first value, a second value and a third value, wherein when the period of the clock signal has the third value, pulses of the clock signal are synchronous with pulses of the synchronization signal; and a logic circuit coupled to the input to receive the synchronization signal and coupled to the output to provide the clock signal, wherein the period of the clock signal is set to one of the first value, the second value and the third value based on the logic level of the synchronization signal and based on the period of the synchronization signal.

10. The pulse generator of claim 9, wherein the logic circuit includes an oscillator that generates the clock signal, the oscillator having a first mode of operation during which the period of the clock signal has the first value, a second mode of operation during which the period of the clock signal has the second value and a third mode of operation during which the period of the clock signal has the third value, the oscillator having an input to receive a control signal to control the mode of operation of the oscillator.

11. The pulse generator of claim 10, wherein the logic circuit further includes a state machine having an input coupled to the input of the pulse generator to receive the synchronization signal and an output coupled to the input of the oscillator to provide the control signal to the oscillator.

12. The pulse generator of claim 11, wherein the state machine has a first state in which the control signal is at a first logic level and a second state in which the control signal is at a second logic level.

13. The pulse generator of claim 12, further comprising a masking circuit, disposed between the logic circuit and the output of the pulse generator, that is operational when the pulse generator is generating the clock signal having a period equal to the first value, the masking circuit disabling the output clock signal for a period of time after the transition of the logic level of the synchronization signal from the first value to the second value.

14. The pulse generator of claim 13, wherein:

the state machine has a second output to provide a masking signal having one of a first and a second logic level;

the state machine has a third state in which the masking signal is at the first logic level; and the masking circuit has a second input coupled to the second output of the state machine to receive the masking signal, the masking circuit disabling the clock signal when the masking signal is at the first logic level.

15. The pulse generator of claim 14, wherein the oscillator has a second output for providing a pulse signal, and wherein the state machine has a counter having an input coupled to the second output of the oscillator to receive the pulse signal, the counter counting pulses of the pulse signal and providing an output signal when the pulses counted exceeds a predetermined value.

16. The pulse generator of claim 9, further comprising a masking circuit, disposed between the logic circuit and the output, that is operational when the pulse generator is generating the clock signal having a period equal to the first value, the masking circuit disabling the output clock signal for a period of time after the transition of the logic level of the synchronization signal from the first value to the second value.

17. A pulse generator comprising:

an input to receive a synchronization signal having a variable period and having a logic level having one of a first value and a second value; and means for providing a clock signal having a period equal to one of a first value, a second value and a third value, wherein when the period of the clock signal has the third value, pulses of the clock signal are synchronous with pulses of the synchronization signal, wherein the period of the clock signal is set to one of the first value, the second value and the third value based on the logic level of the synchronization signal and the period of the synchronization signal.

18. The pulse generator of claim 17, further comprising means for disabling the clock signal for a period of time after the transition of the logic level of the synchronization signal from the first value to the second value.

19. The pulse generator of claim 18, further comprising means for switching the clock period from the first value to the second value a predetermined time after the logic level of the synchronization signal transitions from the first value to the second value.

20. The pulse generator of claim 19, further comprising means for switching the clock period from the first value to the second value a predetermined time after the logic level of the synchronization signal transitions from the first value to the second value.

21. A method of generating a clock signal, having a period, in response to a synchronization signal having a variable period and having a logic level having one of a first value and a second value, the method comprising steps of:

setting the period of the clock signal to a first value when the logic level of the synchronization signal has the first value;

setting the period of the clock signal to a second value after the logic level of the synchronization signal transitions from the first value to the second value; and setting the period of the clock signal equal to the period of the synchronization signal, when the period of the synchronization signal is less than a predetermined value.

22. The method of claim 21, further comprising a step of suppressing one pulse of the clock signal when the period of the clock signal is equal to the second value and the logic level of the synchronization signal transitions from the first value to the second value.

23. The method of claim 22, wherein the step of setting the period of the clock signal to a second value includes steps of:

enabling a counter;

monitoring an output count of the counter; and setting the period of the clock signal to the second value when the output count is equal to a predetermined value.

24. The method of claim 23, wherein the step of setting the period of the clock signal to the period of the synchronization signal includes a step of synchronizing pulses of the clock signal with pulses of the synchronization signal.

25. The method of claim 21, wherein the step of setting the period of the clock signal to a second value includes steps of:

enabling a counter;

monitoring an output count of the counter; and setting the period of the clock signal to the second value when the output count is equal to a predetermined value.

26. The method of claim 21, wherein the step of setting the period of the clock signal to the period of the synchronization signal includes a step of synchronizing pulses of the clock signal with pulses of the synchronization signal.

* * * * *

UNITED STATES PATENT AND TRADEMARK OFFICE
CERTIFICATE OF CORRECTION

PATENT NO. :   5,821,781
DATED       :   October 13, 1998
INVENTOR(S):   Luca Rigazio It is certified that error appears in the above-identified patent and that said Letters Patent is hereby corrected as shown below:

Column 8, line 25, change "19" to --20--.
Column 10, line 22, change "(block 39)" to --(block 46)--.

Signed and Sealed this

Sixteenth Day of February, 1999

Attest:

Attesting Officer

Acting Commissioner of Patents and Trademarks